United States Patent
Li et al.

(10) Patent No.: US 10,146,385 B2
(45) Date of Patent: Dec. 4, 2018

(54) TOUCH SUBSTRATE, DISPLAY DEVICE AND METHOD FOR DETECTING TOUCH ELECTRODE PATTERN

(71) Applicants: BOE TECHNOLOGY GROUP CO., LTD., Beijing (CN); BOE (HEBEI) MOBILE DISPLAY TECHNOLOGY CO., LTD., Gu'An, Hebei (CN)

(72) Inventors: Xuefeng Li, Beijing (CN); Dahua Zhu, Beijing (CN); Zhanbo Sun, Beijing (CN)

(73) Assignees: BOE TECHNOLOGY GROUP CO., LTD., Beijing (CN); BOE (HEBEI) MOBILE DISPLAY TECHNOLOGY CO., LTD., Gu'An, Hebei (CN)

( * ) Notice: Subject to any disclaimer, the term of this patent is extended or adjusted under 35 U.S.C. 154(b) by 0 days.

(21) Appl. No.: 15/327,847

(22) PCT Filed: Dec. 29, 2015

(86) PCT No.: PCT/CN2015/099331
§ 371 (c)(1),
(2) Date: Jan. 20, 2017

(87) PCT Pub. No.: WO2017/024737
PCT Pub. Date: Feb. 16, 2017

(65) Prior Publication Data
US 2017/0205912 A1    Jul. 20, 2017

(30) Foreign Application Priority Data
Aug. 13, 2015  (CN) .......................... 2015 1 0496939

(51) Int. Cl.
*G09G 5/00*    (2006.01)
*G06F 3/044*   (2006.01)
(Continued)

(52) U.S. Cl.
CPC ............ *G06F 3/044* (2013.01); *G06F 3/0412* (2013.01); *H05K 1/0268* (2013.01)

(58) Field of Classification Search
CPC .. G06F 2203/04111; G06F 2203/04112; G06F 3/044
(Continued)

(56) References Cited

U.S. PATENT DOCUMENTS

| | | | | |
|---|---|---|---|---|
| 2011/0018557 A1* | 1/2011 | Badaye | .................. | G06F 3/044 324/658 |
| 2011/0062974 A1* | 3/2011 | Day | ....................... | G06F 3/041 324/713 |

(Continued)

FOREIGN PATENT DOCUMENTS

| | | |
|---|---|---|
| CN | 101408825 A | 4/2009 |
| CN | 102866322 A | 1/2013 |

(Continued)

OTHER PUBLICATIONS

International Search Report and Written Opinion dated May 24, 2016: PCT/CN2015/099331.

(Continued)

*Primary Examiner* — Jennifer Nguyen
(74) *Attorney, Agent, or Firm* — Ladas & Parry LLP; Loren K. Thompson

(57) ABSTRACT

A touch substrate, a display device and a detection method of a touch electrode pattern are disclosed. The touch substrate including a plurality of touch electrodes sequentially arranged along a first direction, in which each touch electrode is extended along a second direction; each touch electrode has a head end, a middle end and a tail end; the middle end is close to a first edge of the touch substrate, and the head end and the tail end are close to a second edge of the touch substrate and are respectively connected with contact pads; and the contact pads connected with the head end and the tail end of the same touch electrode are different. The touch substrate can avoid the waste of module materials.

19 Claims, 11 Drawing Sheets

(51) Int. Cl.
*G06F 3/041* (2006.01)
*H05K 1/02* (2006.01)

(58) Field of Classification Search
USPC .............................. 345/174, 173; 178/18.06
See application file for complete search history.

(56) References Cited

U.S. PATENT DOCUMENTS

2014/0078104 A1* 3/2014 Lee .................. G06F 3/044
345/174
2016/0179266 A1* 6/2016 Yang ................ G06F 3/044
345/174
2016/0357306 A1* 12/2016 Zou .................. G02F 1/13338

FOREIGN PATENT DOCUMENTS

| CN | 104049814 A | 9/2014 |
| CN | 104459400 A | 3/2015 |
| CN | 204423346 U | 6/2015 |
| CN | 105094436 A | 11/2015 |
| KR | 1020140031088 A | 3/2014 |

OTHER PUBLICATIONS

The First Chinese Office Action dated Aug. 1, 2017; Appln. 201510496939.6.

\* cited by examiner

TOUCH SUBSTRATE, DISPLAY DEVICE AND METHOD FOR DETECTING TOUCH ELECTRODE PATTERN

TECHNICAL FIELD

At least one embodiment of the present disclosure relates to a touch substrate, a display device and a method for detecting a touch electrode pattern.

BACKGROUND

With the rapid development of the display technology, touch panels have been gradually widely applied in people's live.

Hybrid in cell (HIC) touch panels have become a kind of mainstream touch panels and each comprises an array substrate and an opposing substrate (e.g., a color filter (CF) substrate). For instance, a plurality of touch driving electrodes are disposed on the array substrate; a plurality of touch sensing electrodes are disposed on one surface of the opposing substrate away from the array substrate; and the extension direction of the touch sensing electrodes is intercrossed with the extension direction of the touch driving electrodes. Driving signals are applied to the touch driving electrodes. As there is mutual capacitance between the touch driving electrodes and the touch sensing electrodes, the sensing signals can be received from the touch sensing electrodes. When a touch object (e.g., a human finger) is close to a touch sensing electrode, the mutual capacitance between the touch driving electrode and a touch sensing electrode will change, and hence the touch position can be determined according to the variation of the mutual capacitance.

SUMMARY

At least one embodiment of the present disclosure provides a touch substrate, a display device and a method for detecting a touch electrode pattern, which can detect the line quality of a touch driving electrode or a touch sensing electrode before the manufacturing process of a display module and hence avoid the waste of module materials.

At least one embodiment of the present disclosure provides a touch substrate, comprising a plurality of touch electrodes sequentially arranged along a first direction, in which each touch electrode is extended along a second direction; wherein the second direction is intercrossed with the first direction; each touch electrode has a middle end, a head end and a tail end; the head end, the middle end and the tail end are electrically connected in sequence; a first touch electrode portion is disposed between the head end and the middle end; a second touch electrode portion is disposed between the middle end and the tail end; along the second direction, the middle end is close to a first edge of the touch substrate, and the head end and the tail end are close to a second edge of the touch substrate; the head end and the tail end are respectively connected with contact pads; and the contact pads connected with the head end and the tail end of the same touch electrode are different.

At least one embodiment of the present disclosure further provides a display device, comprising the above-mentioned touch substrate.

At least one embodiment of the present disclosure still further provides a method for detecting a touch electrode pattern, wherein the touch electrode pattern includes a plurality of touch electrodes arranged along a first direction; each touch electrode is extended along a second direction; the second direction is intercrossed with the first direction; each touch electrode has a middle end, a head end and a tail end; the head end, the middle end and the tail end are electrically connected with each other in sequence; a first touch electrode portion is disposed between the head end and the middle end; a second touch electrode portion is disposed between the middle end and the tail end; along the second direction, the middle end is close to a first edge of the touch substrate, and the head end and the tail end are close to a second edge of the touch substrate; the head end and the tail end are respectively connected with contact pads; the contact pads connected with the head end and the tail end of the same touch electrode are different; and the detection method comprises: detecting at least one of resistance and capacitance between the first touch electrode portion and the second touch electrode portion of the touch electrode via the contact pads respectively connected with the head end and the tail end of each touch electrode, in which if the resistance is within a first reference resistance range or the capacitance is zero (0), it is determined the touch electrode does not suffer from open circuit; and if the resistance is beyond the first reference resistance range or the capacitance is greater than 0, it is determined the touch electrode suffers from open circuit.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 1b is a schematic enlarged view of area A in FIG. 1a;

FIGS. 1c and 1d are schematic diagrams illustrating the connection between each touch electrode and the lead corresponding to the touch electrode in the touch substrate as shown in FIG. 1a;

FIG. 2b is a schematic enlarged view of area A in FIG. 2a;

FIG. 2c is a schematic diagram illustrating the connection between each touch electrode and the lead corresponding to the touch electrode in the touch substrate as shown in FIG. 2a;

FIG. 3b is a schematic enlarged view of area A in FIG. 3a;

DETAILED DESCRIPTION

Figure 1A:
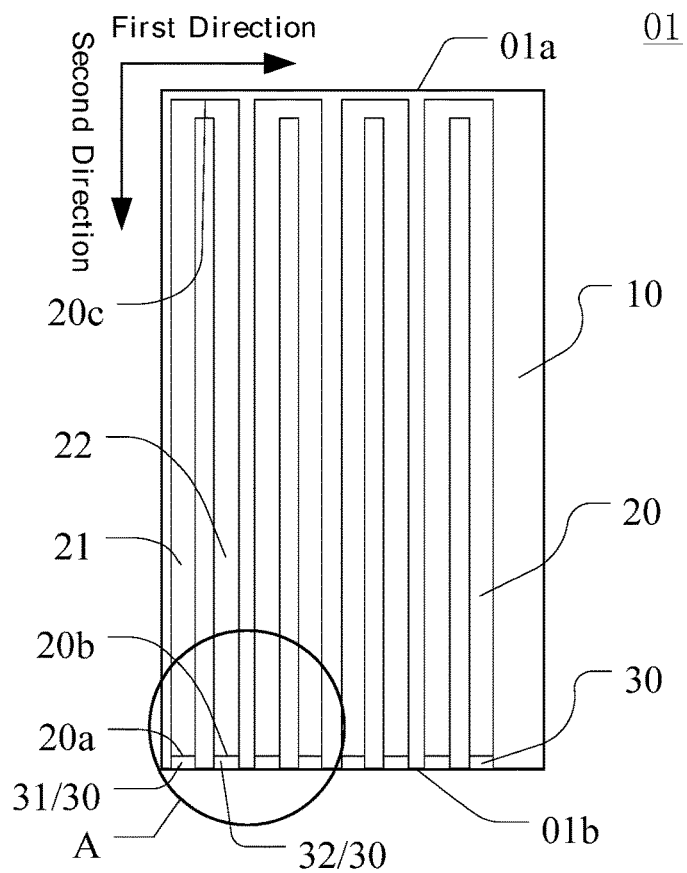
FIG. 1a is a schematic sectional view of a touch substrate provided by the first embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The inventors of the application has noted in the study that: as touch driving electrodes are not connected with a driving circuit (e.g., a driving chip) before an array substrate and an opposing substrate are assembled to form a display module and hence cannot be applied with signals, and the line condition (e.g., whether there is open circuit, short circuit or the like) of touch sensing electrodes can only be detected in the condition where the touch driving electrodes emit signals and the touch sensing electrodes sense the signals, and by adoption of the setting of the touch driving electrodes and the touch sensing electrodes commonly applied in the related field, the line condition of the touch sensing electrodes cannot be detected before the manufacturing process of the display module and can only be detected after the assembly of the display module, so the materials such as polarizers, driving chips, flexible printed circuit boards (PCBs) and backlights may be wasted.

At least one embodiment of the present disclosure provides a touch substrate, a display device and a method for detecting a touch electrode pattern. As for an on-cell touch product (e.g., an HIC product), the embodiment of the present disclosure provides a capacitive touch electrode pattern, which can detect the line quality of the touch driving electrodes or the touch sensing electrodes before the manufacturing process of the display module, for instance, can independently test the quality of touch sensing lines independent of touch driving lines, avoid the case that defective products are finally assembled into the display module, and hence can avoid the waste of module materials.

At least one embodiment of the present disclosure provides a touch substrate, comprising a plurality of touch electrodes sequentially arranged along a first direction, in which each touch electrode is extended along a second direction; wherein the second direction is intercrossed with the first direction; each touch electrode has a middle end, a head end and a tail end; the head end, the middle end and the tail end are electrically connected in sequence; a first touch electrode portion is disposed between the head end and the middle end; a second touch electrode portion is disposed between the middle end and the tail end; along the second direction, the middle end is close to a first edge of the touch substrate, and the head end and the tail end are close to a second edge of the touch substrate; the head end and the tail end are respectively connected with contact pads; and the contact pads connected with the head end and the tail end of the same touch electrode are different. At least one embodiment of the present disclosure provides a detection method, which comprises: detecting at least one of resistance and capacitance between the first touch electrode portion and the second touch electrode portion of the touch electrode via the contact pads respectively connected with the head end and the tail end of each touch electrode, in which if the resistance is within a first reference resistance range or the capacitance is zero (0), it is determined the touch electrode does not suffer from open circuit; and if the resistance is beyond the first reference resistance range or the capacitance is greater than 0, it is determined the touch electrode suffers from open circuit.

Moreover, in at least one embodiment of the present disclosure, the touch substrate may further comprise: a plurality of detection electrodes sequentially arranged along the first direction, in which each detection electrode is extended along the second direction; a contact pad is disposed on an end portion of each detection electrode on the second edge of the touch substrate, and the other end of the detection electrode on the first edge of the touch substrate is suspended; and each detection electrode is adjacent to and spaced from at least one touch electrode. Correspondingly, the detection method provided by at least one embodiment of the present disclosure may further comprise: detecting at least one of the resistance and the capacitance between each touch electrode and each detection electrode adjacent to the touch electrode. It can be determined which one of the first touch electrode portion and the second touch electrode portion of each disconnected touch electrode suffers from open circuit by utilization of the detection electrode; and/or in some embodiments, whether there is short circuit between adjacent touch electrodes can be determined, and in some cases, whether the film thickness of the touch electrodes is abnormal can also be determined by utilization of the detection electrode.

Detailed description will be given below to the touch substrate, the display device and the method for detecting the touch electrode pattern, provided by the embodiments of the present disclosure, with reference to the accompanying drawings and the preferred embodiments.

The dimension and the shape of various parts in the accompanying drawings do not reflect the true scale and are only intended to illustrate the content of the embodiment of the present disclosure.

First Embodiment

This embodiment provides a touch substrate 01. As illustrated in FIG. 1a, the touch substrate comprises a plurality of touch electrodes 20 sequentially arranged along a first direction, in which each touch electrode 20 is extended along a second direction; the second direction is intercrossed with the first direction; each touch electrode 20 comprises a middle end 20c, a head end 20a and a tail end 20b; the head end 20a, the middle end 20c and the tail end 20b are electrically connected in sequence; a first touch electrode portion 21 is disposed between the head end 20a and the middle end 20c; a second touch electrode portion 22 is disposed between the middle end 20c and the tail end 20b; along the second direction, the middle end 20c is close to a first edge 01a of the touch substrate 01, and the head end 20a and the tail end 20b are close to a second edge 01b of the touch substrate 01; the head end 20a and the tail end 20b are respectively connected with contact pads (an output terminal) 30; and the contact pads 30 connected with the head end and the tail end of the same touch electrode 20 are different.

In the touch substrate provided by the embodiment, an orthographic projection of each touch electrode 20 on a surface provided with the plurality of touch electrodes is designed to be U-shaped. Before an assembling process of a display module, a contact pad on the head end 20a and a contact pad on the tail end 20b of the U-shaped touch electrode are spaced from each other, so that a lead can be independently arranged to detect the resistance of the U-shaped touch electrode or the capacitance between the first touch electrode portion 21 and the second touch electrode portion 22 of the U-shaped touch electrode, and hence whether the U-shaped touch electrode suffers from open circuit can be detected.

It should be noted that description is given with reference to FIG. 1a by only taking the case that the planar shape of the touch substrate is a quadrangle as an example. In this case, the first edge and the second edge of the touch substrate may be respectively two edges of the quadrangle. The embodiment of the present disclosure includes but not limited to this case. For instance, the planar shape of the touch substrate may also be a circle, an ellipse, etc. In this case, the first edge of the touch substrate may be a first portion of an edge of the circular or elliptical touch substrate, and the first portion is disposed on a first side of the touch substrate; the second edge of the touch substrate may be a second portion of the edge of the circular or elliptical touch substrate, and the second portion is disposed on a second side of the touch substrate; and the second side is different from the first side.

In addition, the expression that the contact pads 30 connected with the head end and the tail end of the same touch electrode 20 are different means that: as for the same touch electrode 20, the head end 20a thereof is connected with a first contact pad 31 and the tail end 20b thereof is connected with a second contact pad 32 (as shown in FIG. 1a). That is to say, the head end and the tail end of the same touch electrode 20 are not connected with the same contact pad.

In at least one example, the plurality of touch electrodes 20 may be touch driving electrodes or touch sensing electrodes.

Figure 1B:
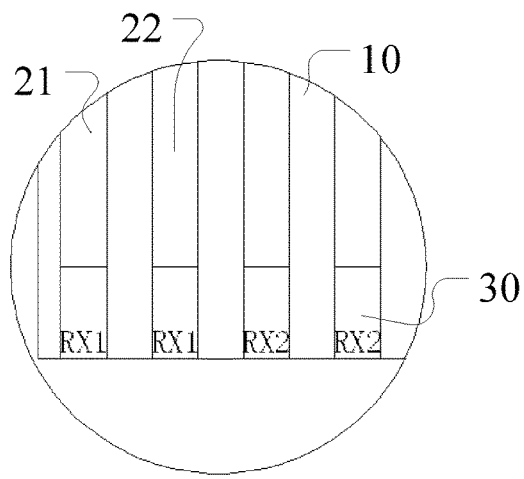

FIG. 1b is a schematic enlarged view of area A in FIG. 1a. FIG. 1b illustrates two touch electrodes. For instance, both the two touch electrodes are touch sensing electrodes and are respectively marked with references Rx1 and Rx2. Detailed description will be given below to the process of detecting whether the touch electrode suffers from open circuit by taking the touch sensing electrode Rx1 in FIG. 1b as an example.

In the test process, contact pads connected with a head end and a tail end of the touch sensing electrode Rx1 as shown in FIG. 1b may be electrically connected with a testing device, and whether the touch sensing electrode Rx1 suffers from open circuit is detected by detecting the resistance or the capacitance between a first touch electrode portion 21 and a second touch electrode portion 22 of the touch sensing electrode Rx1.

The principle of detecting whether the touch sensing electrode Rx1 suffers from open circuit is as follows: theoretically, if the touch sensing electrode Rx1 suffers from open circuit, the first touch electrode portion 21 and the second touch electrode portion 22 thereof are not electrically connected, so the resistance between both is infinitely large, and as both are insulated from each other, the capacitance between both is greater than 0; and if the touch sensing electrode Rx1 does not suffer from open circuit, the first touch electrode portion 21 and the second touch electrode portion 22 thereof are electrically connected, so the capacitance between both is 0, and the resistance between both is detectable. That is to say, if the resistance between the first touch electrode portion 21 and the second touch electrode portion 22 of the touch sensing electrode Rx1 is within the reference resistance range or the capacitance is zero (0), it is determined that the touch sensing electrode Rx1 does not suffer from open circuit; and if the resistance between the first touch electrode portion 21 and the second touch electrode portion 22 is beyond the reference resistance range or the capacitance is not 0, it is determined that the touch sensing electrode Rx1 suffers from open circuit.

It should be noted that the reference resistance range may be determined by the range of the resistance of the plurality of touch electrodes on the touch substrate. For instance, within a certain allowance error, the reference resistance range is from the minimum resistance to the maximum resistance of the plurality of touch electrodes on the touch substrate.

In the touch substrate provided by the embodiment, after the display module is obtained, for instance, two contact pads of each touch electrode may be electrically connected to one lead and hence electrically connected with a touch chip, or one of the contact pads is electrically connected to the lead and electrically connected with the touch chip while the other contact pad is suspended.

Figure 1C:
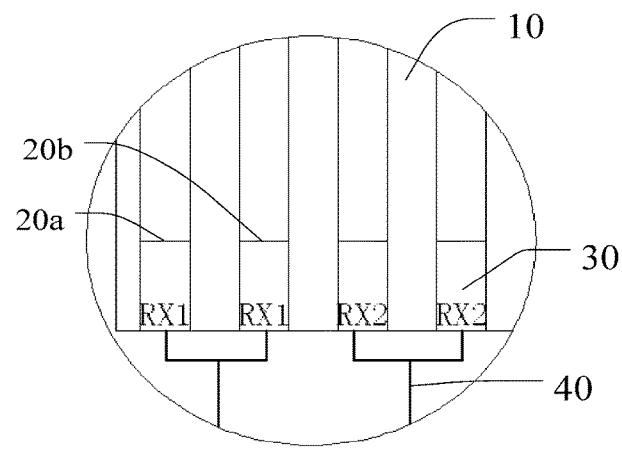

For instance, as illustrated in FIG. 1c, the touch substrate provided by the embodiment may further comprise a plurality of leads 40, and the head end 20a and the tail end 20b of each touch electrode 20 (e.g., the touch sensing electrode Rx1 or Rx2) are respectively connected with the same lead 40 through the contact pads 30. The lead 40 is electrically connected with the touch chip (not shown in FIG. 1c).

Figure 1D:
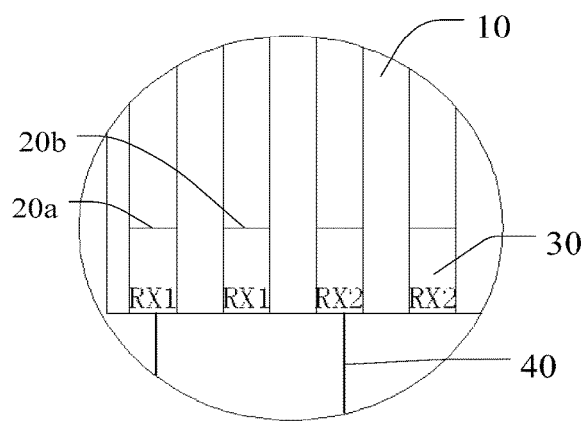

Alternatively, for instance, as illustrated in FIG. 1d, one of the head end 20a and the tail end 20b (e.g., the head end 20a) of each touch electrode may be connected with one lead 40 through the contact pad 30, and the contact pad connected with the other of the head end 20a and the tail end 20b (e.g., the tail end 20b) is suspended.

Of course, the touch substrate provided by the embodiment further comprises a base substrate 10. The base substrate 10 may be a glass substrate, a quartz substrate, a plastic substrate, etc.

Figure 1E:
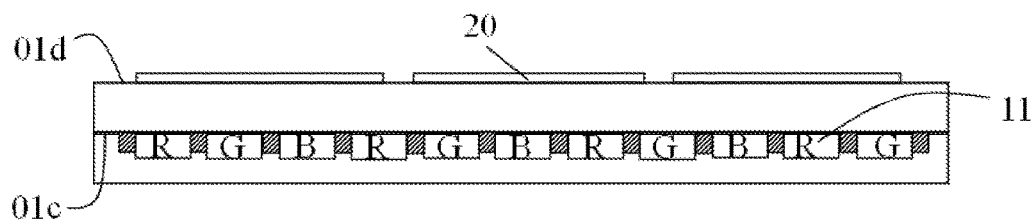
FIG. 1e is a schematic sectional view of the touch substrate provided by the first embodiment of the present disclosure when the touch substrate is a CF substrate.

For instance, as illustrated in FIG. 1e, the touch substrate provided by at least one example of the embodiment may be a color filter (CF) substrate. The CF substrate comprises a CF layer 11 (for instance, including red filter patterns R, green filter patterns G and blue filter patterns B) disposed on a first surface 01c of the CF substrate. The touch electrodes 20 may be disposed on the first surface 01c or a second surface 01d of the CF substrate. The second surface 01d is opposite to the first surface 01e. FIG. 1e only schematically shows the position of the CF layer and the touch electrodes with respect to the CF substrate, and the dimension, the color, the relative relationship and the like thereof are not limited to the case and may be designed according to actual demands. Of course, the touch substrate provided by the embodiment includes but not limited thereto and may be any type of substrate provided with the plurality of touch electrodes 20.

For instance, after the CF substrate and the array substrate are assembled to form a display panel, the CF layer may be within the display panel and the touch electrodes may be disposed on the outside of the display panel, namely disposed on one surface of the CF substrate away from the array substrate; or both the CF layer and the touch electrodes may be disposed on the outside of the display panel.

Figure 1F:
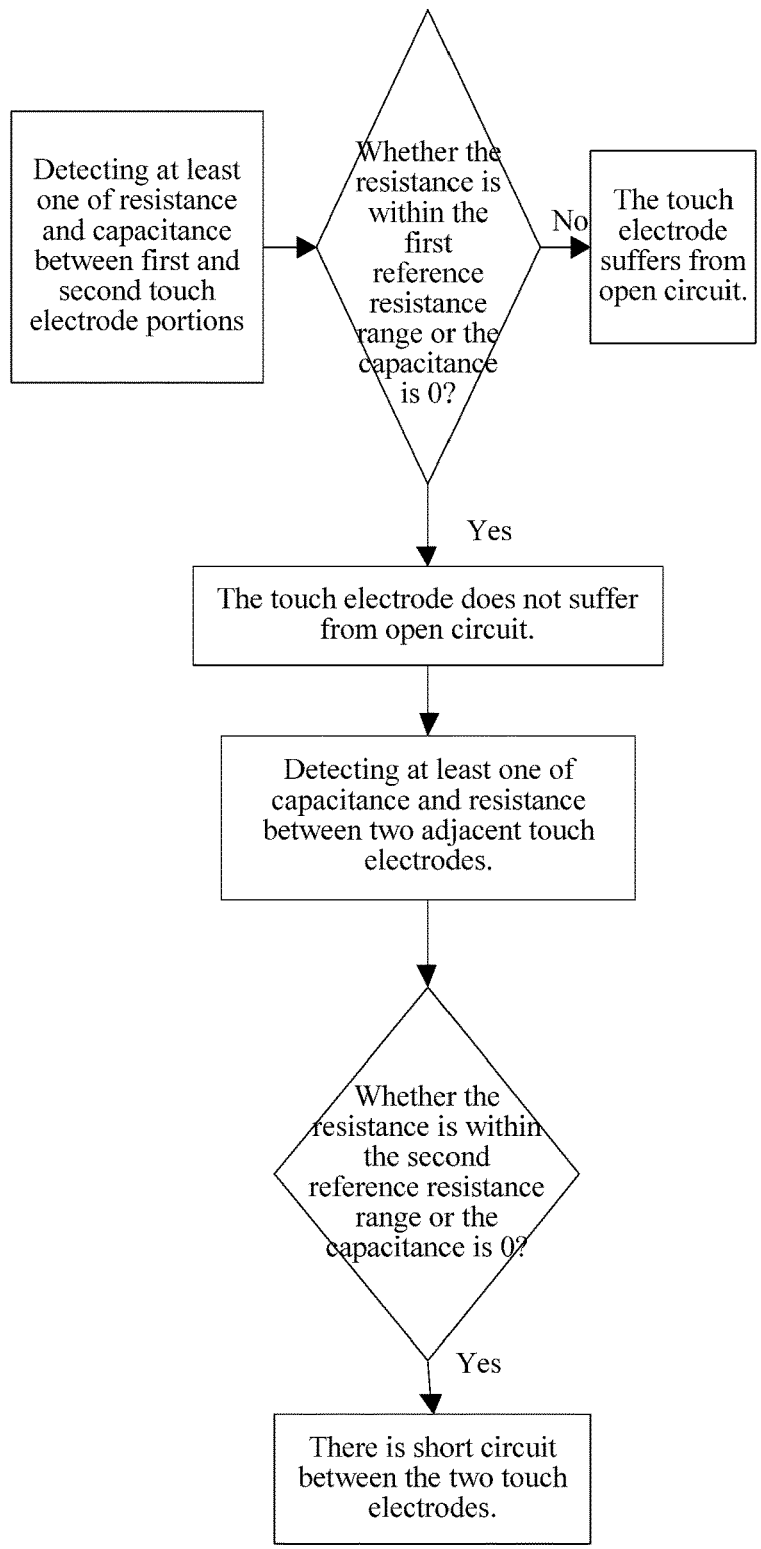
FIG. 1f is a flowchart of a method for detecting a touch electrode pattern provided by the first embodiment of the present disclosure.

As for the pattern of the plurality of touch electrodes in the touch substrate provided by the embodiment, e.g., a touch electrode pattern as shown in FIGS. 1a to 1e, the embodiment further provides a method for detecting a touch electrode pattern. As illustrated in FIG. 1f, the detection method comprises: detecting at least one of the resistance and the capacitance between the first touch electrode portion and the second touch electrode portion of each touch electrode via the contact pads respectively connected with the head end and the tail end of the touch electrode. If the detected resistance is within the first reference resistance range or the detected capacitance is zero (0), it is determined that the touch electrode does not suffer from open circuit. If the detected resistance is beyond the first reference resistance range or the detected capacitance is greater than 0, it is determined that the touch electrode suffers from open circuit.

The process of detecting whether each touch electrode suffers from open circuit may refer to the above description regarding the process of detecting whether the touch sensing electrode Rx1 suffers from open circuit. No further description will be given here. In addition, the first reference resistance range may be determined according to the range of the resistance of the plurality of touch electrodes on the touch substrate. For instance, within a certain allowance error, the first reference resistance range may be from the minimum resistance to the maximum resistance of the plurality of touch electrodes on the touch substrate.

For instance, as illustrated in FIG. 1f, the detection method provided by at least one example of the embodiment may further comprise: detecting at least one of the capacitance and the resistance between adjacent touch electrodes when each touch electrode does not suffer from open circuit. If the resistance between the adjacent touch electrodes is within the second reference resistance range or the capacitance is zero (0), it is determined that there is short circuit between the adjacent touch electrodes.

Taking the touch sensing electrodes Rx1 and Rx2 in FIG. 1b as an example, when both the two touch sensing electrodes do not suffer from open circuit, if there is short circuit between the two touch sensing electrodes, the capacitance between the two touch sensing electrodes is 0, and the resistance between the two touch sensing electrodes is detectable. Therefore, whether there is short circuit between the two electrodes may be determined by detecting the capacitance or the resistance between the two touch sensing electrodes.

It should be noted that the resistance between the touch sensing electrodes Rx1 and Rx2 may be the resistance between the first touch electrode portion or the second touch electrode portion of the touch sensing electrode Rx1 and the first touch electrode portion or the second touch electrode portion of the touch sensing electrode Rx2. Similarly, the second reference resistance range may be determined according to the resistance between every two adjacent touch electrodes in the plurality of touch electrodes on the touch substrate.

Second Embodiment

Figure 2A:
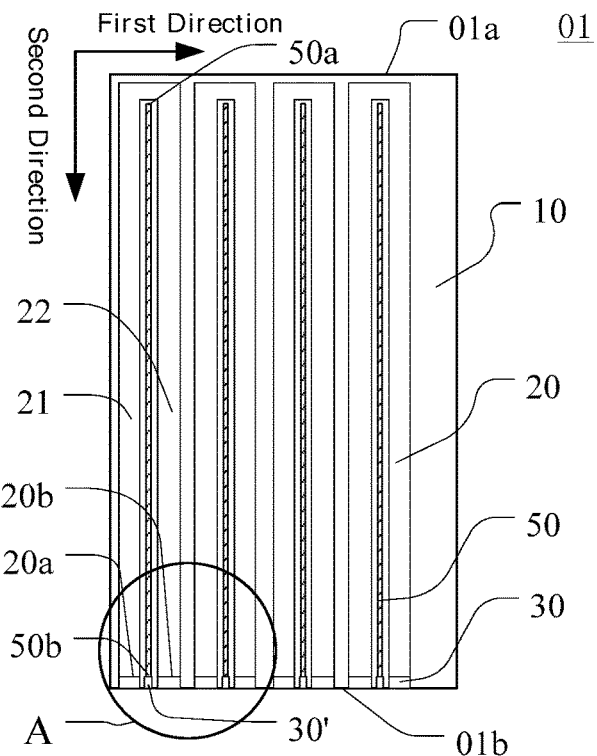
FIG. 2a is a schematic sectional view of a touch substrate provided by the second embodiment of the present disclosure.

Compared with the first embodiment, the touch substrate 01 provided by the embodiment not only comprises the plurality of touch electrodes 20 but also, as shown in FIG. 2a, may further comprise: a plurality of detection electrodes 50 sequentially arranged along the first direction, in which each detection electrode 50 is extended along the second direction; a contact pad 30' spaced from the contact pad 30 is disposed on an end portion 50b of each detection electrode 50 on a second edge 01b of the touch substrate 01, and the other end 50a of the detection electrode 50 on a first edge 01a of the touch substrate 01 is suspended; and each detection electrode 50 is adjacent to and spaced from at least one touch electrode 20. One detection electrode 50 is disposed between the first touch electrode portion 21 and the second touch electrode portion 22 of each touch electrode 20, and the detection electrode 50 is parallel to the first touch electrode portion 21 and the second touch electrode portion 22.

For instance, the plurality of detection electrodes 50 and the plurality of touch electrodes 20 may be arranged in the same layer.

When the detection electrodes 50 and the touch electrodes 20 are arranged in the same layer, the distance between the detection electrode 50 and the touch electrode 20 and the width of each detection electrode 50 may be designed according to the actual dimension of the touch substrate, so as to avoid the short circuit between the detection electrode 50 and the touch electrode 20 and avoid the case that the detection electrode 50 has too large dimension and hence occupies large space of the touch substrate. For instance, the distance between each detection electrode 50 and the touch electrode 20 adjacent to the detection electrode may be from 10 μm to 100 μm. For instance, the width of each detection electrode along the first direction may be from 10 μm to 100 μm.

In the embodiment, each touch electrode 20 is provided encircling one detection electrode 50, and the detection electrode 50 is parallel to the first touch electrode portion and the second touch electrode portion. In this way, whether the first touch electrode portion or the second touch electrode portion of the touch electrode suffers from open circuit may be determined by detecting the capacitance between the detection electrode 50 and the first touch electrode portion and the second touch electrode portion of the touch electrode.

For the convenient comparison of the capacitance of the detection electrode with the first touch electrode portion and the second touch electrode portion of each touch electrode, for instance, the first touch electrode portion and the second touch electrode portion of the touch electrode may be provided to be axisymmetrical with respect to the center line of the detection electrode.

Detailed description will be given below to the principle of determining whether the first touch electrode portion or the second touch electrode portion of the touch electrode suffers from open circuit by utilization of the detection electrode.

Figure 2B:
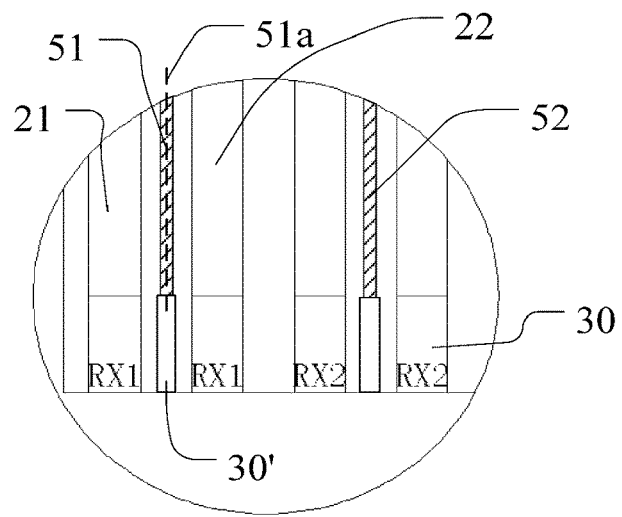

For instance, as illustrated in FIG. 2b, the touch sensing electrode Rx1 is adjacent to a detection electrode 51, and both the first touch electrode portion 21 and the second touch electrode portion 22 of the touch sensing electrode Rx1 are parallel to the detection electrode 51 and axisymmetrical with respect to the center line 51a of the detection electrode 51.

The first capacitance C1 between the first touch electrode portion 21 of the touch sensing electrode Rx1 and the detection electrode 51 and the second capacitance C2 between the second touch electrode portion 22 of the touch sensing electrode Rx1 and the detection electrode 51 may be detected by the electrical connection between a detection device and contact pads of the touch sensing electrode Rx1 and the detection electrode 51. When the first touch electrode portion 21 and the second touch electrode portion 22 of the touch sensing electrode Rx1 are axisymmetrical with respect to the center line 51a of the detection electrode 51, the capacitance C1 and C2 mainly depend on the length of the first touch electrode portion 21 and the second touch electrode portion 22 of the touch sensing electrode Rx1 respectively. Therefore, if the values of the capacitance C1 and C2 are compared, the user only needs to compare the length of the first touch electrode portion 21 and the length of the second touch electrode portion 22.

For instance, if C1>C2>0, the length of the first touch electrode portion 21 of the touch sensing electrode Rx1 is greater than the length of the second touch electrode portion 22, so the second touch electrode portion 22 suffers from open circuit; and if 0<C1<C2, the length of the first touch electrode portion 21 of the touch sensing electrode Rx1 is less than the length of the second touch electrode portion 22, so the first touch electrode portion 21 suffers from open circuit. In the embodiment, both C1 and C2 are greater than 0, that is to say, the detection electrode 51 and any portion of the touch sensing electrode Rx1 are insulated from each other.

Similarly, whether the first touch electrode portion or the second touch electrode portion suffers from open circuit when the touch sensing electrode Rx2 as whole suffers from open circuit may be detected by utilization of a detection electrode 52.

Figure 2C:
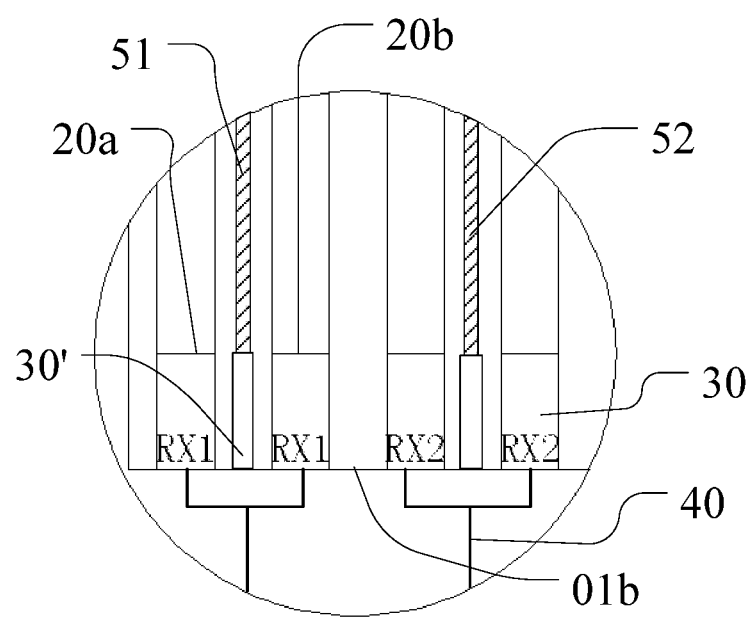

For instance, as illustrated in FIG. 2c, the touch substrate provided by the embodiment may further comprise a plurality of leads 40, and the head end 20a and the tail end 20b of each touch electrode (e.g., the touch sensing electrode Rx1 or Rx2) are respectively connected with the same lead 40 through the contact pads 30. The lead 40 is electrically connected with a touch chip (not shown in FIG. 2c). An end portion of each detection electrode (e.g., the detection electrode 51 or 52) on the first edge of the touch substrate 01 is suspended (refer to the position in FIG. 2a); an end portion of the detection electrode on the second edge 01b of the touch substrate is electrically connected with one end of the contact pad 30'; and the other end of the contact pad 30' is suspended.

Figure 2D:
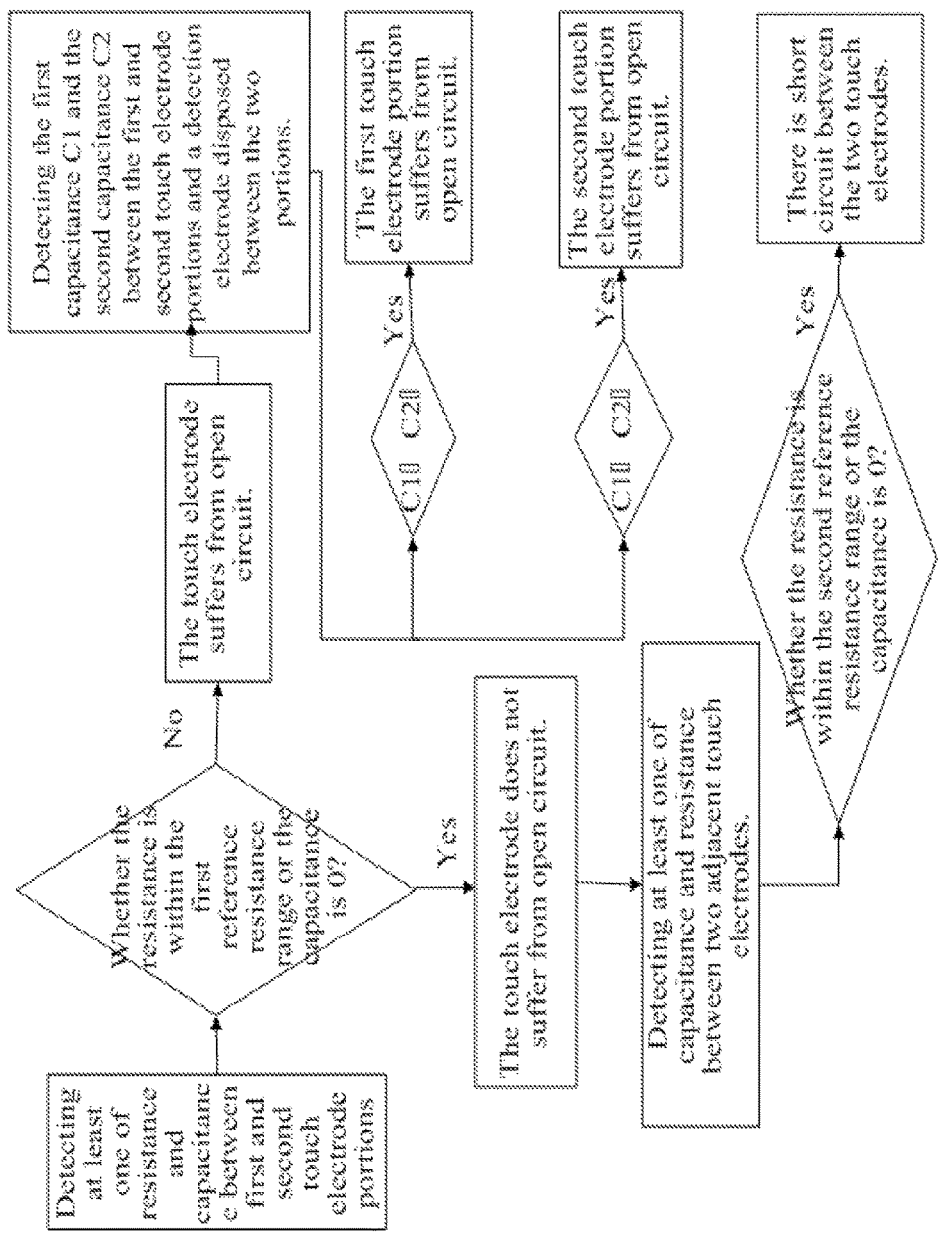
FIG. 2d is a flowchart of a method for detecting a touch electrode pattern provided by the second embodiment of the present disclosure.

As for the patterns of the plurality of touch electrodes in the touch substrate provided by the embodiment, for instance, a touch electrode pattern as shown in FIGS. 2a to 2c, that is to say, one detection electrode is disposed between the first touch electrode portion and the second touch electrode portion of each touch electrode, and the first touch electrode portion and the second touch electrode portion of the touch electrode are parallel to the detection electrode and axisymmetrical with respect to the center line of the detection electrode, the embodiment further provides a method for detecting a touch electrode pattern. As illustrated in FIG. 2d, on the basis of the detection method provided by the first embodiment, the detection method may further comprise: detecting the first capacitance between the first touch electrode portion and the detection electrode between the first touch electrode portion and the second touch electrode portion of the touch electrode and the second capacitance between the detection electrode and the second touch electrode portion when the touch electrode suffers from open circuit. In the method, if the first capacitance is less than the second capacitance, it is determined that the first touch electrode portion of the touch electrode suffers from open circuit; and if the first capacitance is greater than the second capacitance, it is determined that the second touch electrode portion of the touch electrode suffers from open circuit. Of course, both the first capacitance and the second capacitance are not zero (0).

It should be noted that description is given in the embodiment by taking the case that one detection electrode is disposed between the first touch electrode portion and the second touch electrode portion of each touch electrode as an example, so that whether the first touch electrode portion or the second touch electrode of each touch electrode suffers from open circuit can be detected with respect to each touch electrode. The embodiment includes but not limited to the above case. For instance, whether the first touch electrode portion or the second touch electrode portion of each of portion of the touch electrodes may also be detected with respect to this portion of the touch electrodes according to actual demands.

Third Embodiment

Figure 3A:
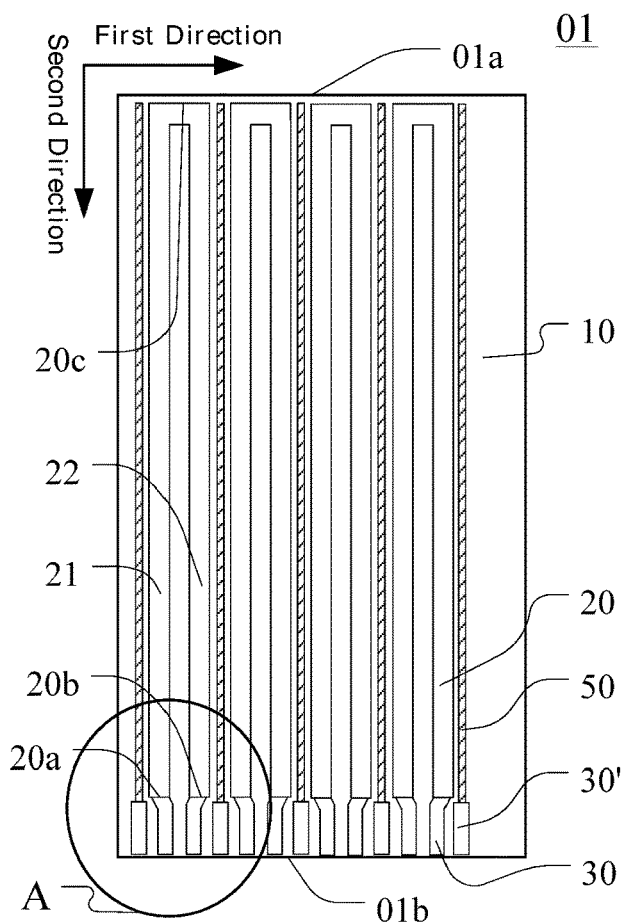
FIG. 3a is a schematic sectional view of a touch substrate provided by the third embodiment of the present disclosure.
Figure 3B:
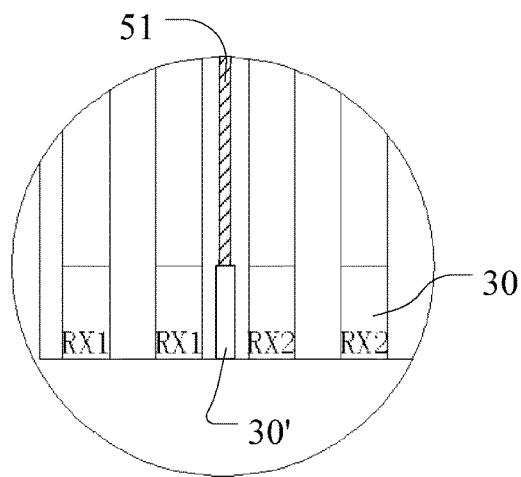

Comparing the touch substrate provided by the embodiment and the touch substrate provided by the second embodiment, the difference is as follows: as illustrated in FIGS. 3a and 3b, one detection electrode 50 is disposed between every two adjacent touch electrodes 20. Thus, when both the two adjacent touch electrodes do not suffer from open circuit, whether there is short circuit between the two touch electrodes 20 may be determined by detecting the capacitance or the resistance between the two touch electrodes 20 and the detection electrode 50 disposed therebetween.

For instance, as illustrated in FIG. 3b, when both the touch sensing electrodes Rx1 and Rx2 do not suffer from open circuit, if there is short circuit between the two touch sensing electrodes, there is short circuit between the detection electrode 51 disposed therebetween and any of the two touch sensing electrodes, so the capacitance between the detection electrode 51 and any of the touch sensing electrodes is zero (0) or the resistance is detectable. Thus, whether there is short circuit between the two adjacent touch sensing electrodes can be determined.

In addition, when both the two adjacent touch electrodes do not suffer from open circuit, if the capacitance between the detection electrode disposed between the two touch electrodes and each touch electrode is greater than 0 and beyond the reference capacitance range, it is determined that the film thickness of the touch electrode is detected to be abnormal.

Taking touch sensing electrodes Rx1 and Rx2 in FIG. 3b as an example, when the touch sensing electrode Rx1 does not suffer from open circuit, if the capacitance between the touch sensing electrode Rx1 and the detection electrode 51 is greater than zero (0), it can be obtained that there is no short circuit between them. Moreover, if the capacitance between them is beyond the reference capacitance range (namely the normal capacitance range between them), it can be obtained that the film thickness of the touch electrode affects the capacitance, and hence the film thickness of the touch electrode can be determined to be abnormal.

The reference capacitance range may be determined by the capacitance between each detection electrode on the touch substrate in normal condition and each touch electrode adjacent to the detection electrode. No further description will be given here.

Generally, in the process of manufacturing the plurality of touch electrodes on the touch substrate, an independent pattern may be formed between every two adjacent touch electrodes. The independent pattern has same shape as the touch electrodes but is not electrically connected with any other component, so the visibility of the touch electrode can be reduced. The detection electrode in the touch substrate provided by the embodiment may be formed by the independent pattern. For instance, an end portion of one part of the independent pattern is electrically connected with a contact pad, so the part may be taken as the detection electrode.

Figure 3C:
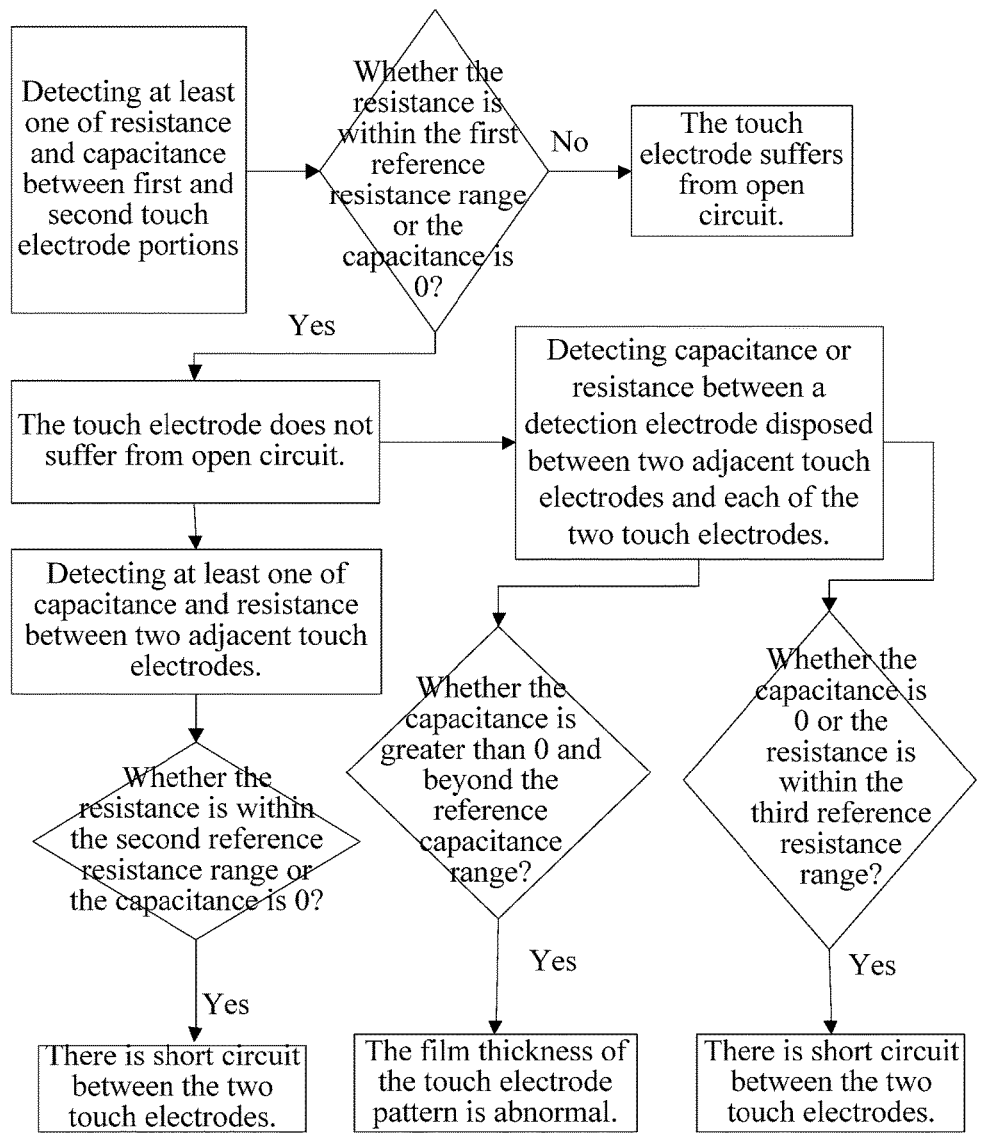
FIG. 3c is a flowchart of a method for detecting a touch electrode pattern provided by the third embodiment of the present disclosure.

With respect to the pattern of the plurality of touch electrodes in the touch substrate provided by the embodiment, for instance, a touch electrode pattern as shown in FIGS. 3a and 3b, the embodiment further provides a method for detecting a touch electrode pattern. As illustrated in FIG. 3c, on the basis of the detection method provided by the first embodiment or the second embodiment, the detection method may further comprise: detecting the capacitance or the resistance between a detection electrode, which is provided between two adjacent touch electrodes, and each of the touch electrodes when the two adjacent touch electrodes do not suffer from open circuit.

In at least one example, if the detected capacitance is zero (0) or the resistance is within the third reference resistance range, it is determined that there is short circuit between the two touch electrodes.

Taking the touch sensing electrode Rx1 and the detection electrode 51 in FIG. 3b as an example, the resistance between them may be the resistance between the first touch electrode portion 21 or the second touch electrode portion 22 of the touch sensing electrode Rx1 and the detection electrode 51 when there is short circuit between the touch sensing electrode Rx1 and the detection electrode 51. Similarly, the third reference resistance range may be determined according to the resistance between each detection electrode on the touch substrate and each touch electrode adjacent to the detection electrode.

In at least one example, if the detected capacitance is greater than 0 and beyond the reference capacitance range, it is determined that the film thickness of the touch electrode pattern is detected to be in an abnormal state.

The reference capacitance range may be determined according to the capacitance between each detection electrode on the touch substrate in a normal condition and each touch electrode adjacent to the detection electrode. No further description will be given here.

It should be noted that description is given in the embodiment by taking the case that one detection electrode is disposed between every two adjacent touch electrodes as an example, so whether there is short circuit between each touch electrode and another touch electrode can be detected. The embodiment includes but not limited to the above. For instance, according to actual demand, the detection electrodes may also be disposed for portion of the touch electrodes so as to detect whether there is short circuit between the portion of the touch electrodes.

Fourth Embodiment

The touch substrate provided by the embodiment combines the proposals of the second embodiment and the third embodiment, can detect whether the first touch electrode portion or the second touch electrode portion of each disconnected touch electrode suffers from open circuit, and can also detect whether there is short circuit between adjacent touch electrodes and whether the film thickness of the touch electrode pattern is abnormal by utilization of the detection electrode when the touch electrodes do not suffer from open circuit.

Figure 4A:
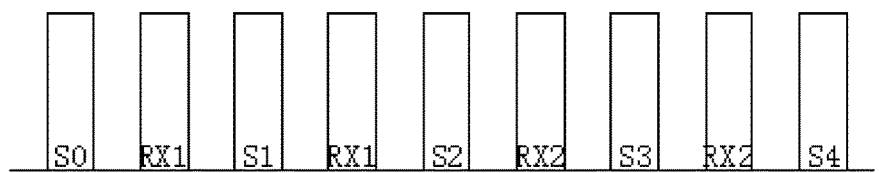
FIG. 4a is a schematic sectional view of a touch substrate provided by the fourth embodiment of the present disclosure.

For instance, as illustrated in FIG. 4a, one detection electrode (e.g., detection electrodes S1, S3, . . . ) is disposed between the first touch electrode portion and the second touch electrode portion of each touch electrode (e.g., touch sensing electrodes Rx1, Rx2, . . . ), and one detection electrode (e.g., detection electrodes S0, S2, S4, . . . ) is disposed between every two adjacent touch electrodes (e.g., the touch sensing electrodes Rx1, Rx2, . . . ).

The detection process of the plurality of touch electrodes in the touch substrate provided by the embodiment may refer to relevant description in the first embodiment, the second embodiment and the third embodiment. No further description will be given here.

Figure 4B:
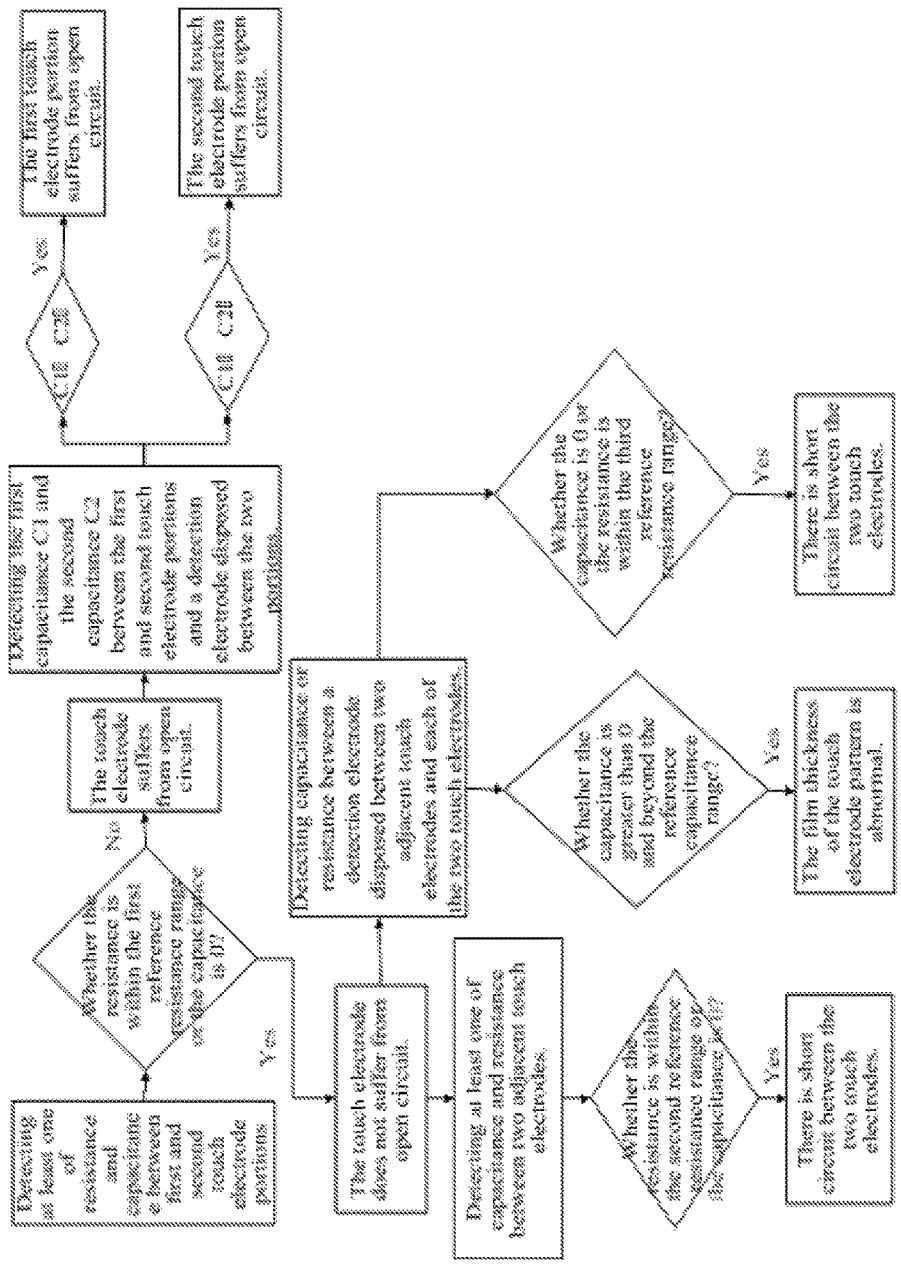
FIG. 4b is a flowchart of a method for detecting a touch electrode pattern provided by the fourth embodiment of the present disclosure.

With respect to the pattern of the plurality of touch electrodes in the touch substrate provided by the embodiment, for instance, a touch electrode pattern as shown in FIG. 4a, as illustrated in FIG. 4b, on the basis of the detection method provided by the first embodiment, the detection method may further comprise: detecting the first capacitance between the first touch electrode portion of the touch electrode and the detection electrode between the first touch electrode portion and the second touch electrode portion of the touch electrode and the second capacitance between the detection electrode and the second touch electrode portion of the touch electrode when the touch electrode suffers from open circuit; and detecting the capacitance or the resistance between the detection electrode between two touch electrodes and each of the two touch electrodes when the two adjacent touch electrodes do not suffer from open circuit.

In the method, if the first capacitance is less than the second capacitance, it is determined that the first touch electrode portion of the touch electrode suffers from open circuit; and if the first capacitance is greater than the second capacitance, it is determined that the second touch electrode portion of the touch electrode suffers from open circuit. Of course, both the first capacitance and the second capacitance are not 0.

Moreover, if the detected capacitance is 0 or the resistance is within the third reference resistance range, it is determined that there is short circuit between the two touch electrodes. If the detected capacitance is greater than 0 and beyond the reference capacitance range, it is determined that the film thickness of the touch electrode pattern is detected to be abnormal.

The detection method provided by the embodiment may refer to relevant description in connection with the first embodiment, the second embodiment and the third embodiment. No further description will be given here.

Fifth Embodiment

The embodiment further provides a display device, which comprises the touch substrate provided by any foregoing embodiment.

Figure 5:
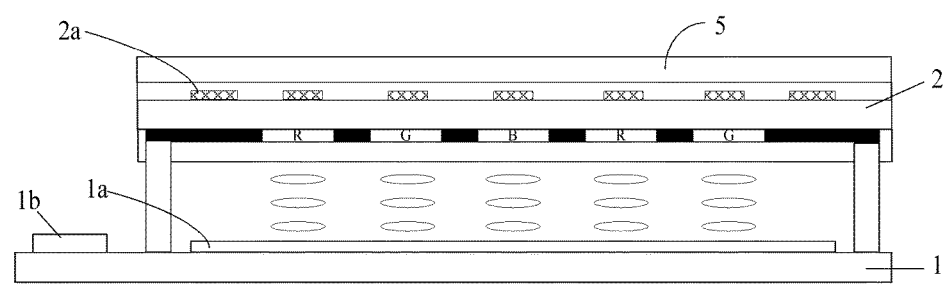
FIG. 5 is a schematic sectional view of a display device provided by the fifth embodiment of the present disclosure.

For instance, as illustrated in FIG. 5, the display device may comprise an array substrate 1 and an opposing substrate 2 arranged opposite to each other. The opposing substrate 2 may be taken as the touch substrate provided by any foregoing embodiment. The plurality of touch electrodes in the touch substrate provided by any foregoing embodiment are arranged on one side of the opposing substrate 2 away from the array substrate 1.

For instance, as illustrated in FIG. 5, a first touch electrode 1a may be disposed between the opposing substrate 2 and the array substrate 1 (e.g., on the array substrate); second touch electrodes 2a may be disposed on one surface of the opposing substrate 2 away from the array substrate 1; and the second touch electrodes 2a may be taken as the touch electrodes in any foregoing embodiment. Alternatively, the first touch electrodes and the second touch electrodes may be disposed on one surface of the opposing substrate 2 away from the array substrate 1, and any of the first touch electrodes and the second touch electrodes may be taken as the touch electrodes in any foregoing embodiment. One of the first touch electrode and the second touch electrode is a touch driving electrode, and the other is a touch sensing electrode.

For instance, the opposing substrate 2 may be a color filter (CF) substrate, namely the opposing substrate 2 is provided with, for instance, a CF layer including red filter patterns R, green filter patterns G and blue filter patterns B; or the opposing substrate 2 may also be a transparent substrate, namely no CF layer is disposed on the opposing substrate.

In addition, in some embodiments, as illustrated in FIG. 5, a protective substrate 5 (e.g., a glass substrate) may further be disposed on one side of the opposing substrate 2 away from the array substrate 1. In some embodiments, a touch chip 1b may also be disposed on the array substrate 1.

In summary, in the touch substrate, the display device and the method for detecting the touch electrode pattern, provided by at least one embodiment of the present disclosure, the planar shape of the touch electrodes is designed to be U-shaped, and the head end and the tail end of each touch electrode are respectively connected with different contact pads, so whether each touch electrode suffers from open circuit can be detected before the manufacturing process of the display module. As the detection electrode is disposed between the first touch electrode portion and the second touch electrode portion of the touch electrode, which of the two portions suffers from open circuit can be detected. Whether there is short circuit between adjacent touch electrodes may be determined by arranging the detection electrode between the adjacent touch electrodes and detecting the capacitance and the resistance between the adjacent touch electrodes and the detection electrode. When the touch electrodes do not suffer from open circuit and are not shorted, whether the film thickness of the touch electrode pattern is abnormal may also be determined by detecting the capacitance between the adjacent touch electrodes and the detection electrode disposed therebetween.

What are described above is related to the illustrative embodiments of the disclosure only and not limitative to the scope of the disclosure; the scopes of the disclosure are defined by the accompanying claims.

The application claims priority to the Chinese patent application No. 201510496939.6, filed Aug. 13, 2015, the entire disclosure of which is incorporated herein by reference as part of the present application.

What is claimed is:

1. A touch substrate, comprising:
   a plurality of first contact pads;
   a plurality of touch electrodes sequentially arranged along a first direction, in which each touch electrode is extended along a second direction; wherein the second direction is intercrossed with the first direction, wherein
   each touch electrode has a middle end, a head end and a tail end,
      wherein the head end, the middle end and the tail end are electrically connected in sequence,
      wherein a first touch electrode portion is disposed between the head end and the middle end,
      wherein a second touch electrode portion is disposed between the middle end and the tail end,
      wherein along the second direction, the middle end is close to a first edge of the touch substrate, and the head end and the tail end are close to a second edge of the touch substrate,
      wherein the head end and the tail end of the touch electrodes are respectively and directly connected to corresponding first contact pads, and
      wherein the first contact pads connected with the head end and the tail end of the same touch electrode are different;
   a plurality of detection electrodes sequentially arranged along the first direction, in which each detection electrode is extended along the second direction;
      a plurality of second contact pads, in which each second contact pad is disposed on an end portion of each detection electrode on the second edge of the touch substrate, wherein the other end of the detection electrode on the first edge of the touch substrate is suspended; and
   each detection electrode is adjacent to and spaced from at least one of the touch electrodes;
   each touch electrode is directly connected to the first contact pads that are connected to it;
   the detection electrodes are configured to detect whether an abnormality exists about the touch electrodes during a test process.

2. The touch substrate according to claim 1, wherein the detection electrodes and the touch electrodes are arranged in a same layer.

3. The touch substrate according to claim 1, wherein one of the detection electrodes is disposed between the first touch electrode portion and the second touch electrode portion of each touch electrode; and the detection electrode is parallel to the first touch electrode portion and the second touch electrode portion.

4. The touch substrate according to claim 3, wherein the first touch electrode portion and the second touch electrode portion of each touch electrode are axisymmetrical with respect to a center line of the detection electrode between them.

5. The touch substrate according to claim 1, wherein one of the detection electrodes is disposed between two adjacent touch electrodes.

6. The touch substrate according to claim 1, wherein a first one of the detection electrodes is disposed between the first touch electrode portion and the second touch electrode portion of each touch electrode; the detection electrode is parallel to the first touch electrode portion and the second touch electrode portion; and a second one of the detection electrodes is disposed between every two adjacent touch electrodes.

7. The touch substrate according to claim 1, further comprising:
a plurality of leads, wherein
the head and tail ends of each touch electrode are connected to a single lead through the first contact pads.

8. The touch substrate according to claim 7, wherein
as for each touch electrode, at least one first contact pad is connected with one of the leads; for each detection electrode, one end of the second contact pad is connected with the each detection electrode, and another end of the second contact pad is directly electrically suspended.

9. The touch substrate according to claim 8, wherein the other end of the second contact pad is insulated from any lead.

10. The touch substrate according to claim 1, wherein the touch substrate is a color filter (CF) substrate; the CF substrate comprises a CF layer disposed on a first surface of the CF substrate; the touch electrodes are disposed on the first or a second surface of the CF substrate; and the second surface is opposite to the first surface.

11. A display device, comprising the touch substrate according to claim 1.

12. The display device according to claim 11, further comprising: an array substrate and an opposing substrate arranged opposite to the array substrate, wherein the opposing substrate is taken as the touch substrate; and the plurality of touch electrodes on the touch substrate are disposed on one side of the opposing substrate, which side is away from the array substrate.

13. A method for detecting the touch substrate of claim 1, comprising:
detecting at least one of resistance and capacitance between the first touch electrode portion and the second touch electrode portion of the touch electrode via the first contact pad respectively connected with the head end and the tail end of each touch electrode, in which
if the resistance is within a first reference resistance range or the capacitance is zero (0), it is determined the touch electrode does not suffer from open circuit; and
if the resistance is beyond the first reference resistance range or the capacitance is greater than 0, it is determined the touch electrode suffers from open circuit.

14. The detection method according to claim 13, further comprising: detecting at least one of capacitance and resistance between adjacent touch electrodes when each touch electrode does not suffer from open circuit, in which
if the resistance between the adjacent touch electrodes is within a second reference resistance range or the capacitance is zero (0), it is determined that there is short circuit between the adjacent touch electrodes.

15. The detection method according to claim 13, wherein one detection electrode is disposed between the first touch electrode portion and the second touch electrode portion of each touch electrode; the first touch electrode portion and the second touch electrode portion of the touch electrode are parallel to the detection electrode and axisymmetrical with respect to a center line of the detection electrode; and the detection method further comprises:
detecting first capacitance between the detection electrode and the first touch electrode portion of the touch electrode and detecting second capacitance between the detection electrode and the second touch electrode portion of the touch electrode when the touch electrode suffers from open circuit, in which if the first capacitance is less than the second capacitance, it is determined that the first touch electrode portion of the touch electrode suffers from open circuit;
if the first capacitance is greater than the second capacitance, it is determined that the second touch electrode portion of the touch electrode suffers from open circuit; and
both the first capacitance and the second capacitance are greater than 0.

16. The detection method according to claim 15, wherein one detection electrode is disposed between every two adjacent touch electrodes; and
the detection method further comprises:
detecting at least one of capacitance and resistance between the detection electrode between the two touch electrodes and each of the two touch electrodes when each of the two touch electrodes does not suffer from open circuit, in which if the capacitance between the detection electrode and each of the two touch electrodes is zero (0) or the resistance is within the third reference resistance range, it is determined that there is short circuit between the two touch electrodes.

17. The detection method according to claim 15, wherein one detection electrode is disposed between every two adjacent touch electrodes; and
the detection method further comprises:
detecting the capacitance between the detection electrode between the two touch electrodes and each of the two touch electrodes when each of the two touch electrodes does not suffer from open circuit, in which
if the capacitance between the detection electrode and each of the two touch electrodes is greater than zero (0) and beyond the reference capacitance range, it is determined that a film thickness of the touch electrode pattern is detected to be abnormal.

18. The detection method according to claim 13, wherein one detection electrode is disposed between every two adjacent touch electrodes; and
the detection method further comprises:
detecting at least one of capacitance and resistance between the detection electrode between the two touch electrodes and each of the two touch electrodes when each of the two touch electrodes does not suffer from open circuit, in which if the capacitance between the detection electrode and each of the two touch electrodes is zero (0) or the resistance is within the third reference resistance range, it is determined that there is short circuit between the two touch electrodes.

19. The detection method according to claim 13, wherein one detection electrode is disposed between every two adjacent touch electrodes; and
the detection method further comprises:
detecting the capacitance between the detection electrode between the two touch electrodes and each of the two touch electrodes when each of the two touch electrodes does not suffer from open circuit, in which
if the capacitance between the detection electrode and each of the two touch electrodes is greater than zero (0) and beyond the reference capacitance range, it is determined that a film thickness of the touch electrode pattern is detected to be abnormal.

* * * * *